(12) United States Patent
Yamatani

(10) Patent No.: US 11,825,733 B2
(45) Date of Patent: Nov. 21, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventor: Akinori Yamatani, Tsurumi-ku (JP)

(73) Assignee: Samsung Display Co., Ltd., Yongin-si (KR)

( * ) Notice: Subject to any disclaimer, the term of this patent is extended or adjusted under 35 U.S.C. 154(b) by 317 days.

(21) Appl. No.: 16/568,068

(22) Filed: Sep. 11, 2019

(65) Prior Publication Data

US 2020/0227639 A1 Jul. 16, 2020

(30) Foreign Application Priority Data

Jan. 11, 2019 (KR) .................. 10-2019-0003819

(51) Int. Cl.
*H01L 51/00* (2006.01)
*H10K 85/30* (2023.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
CPC ...... H01L 51/008; H01L 51/5012; C07F 5/02; C07F 5/027; C09K 11/06; C09K 2211/1018; H10K 85/322
See application file for complete search history.

(56) References Cited

U.S. PATENT DOCUMENTS 10,177,312 B2 1/2019 Parham et al.
2002/0065434 A1 5/2002 Geissler et al.
(Continued)

FOREIGN PATENT DOCUMENTS

CN 106467553 A 3/2017
CN 106467554 A 3/2017
(Continued)

OTHER PUBLICATIONS

Extended European Search Report for corresponding European Patent Application No. 19212247.1, dated May 26, 2020, 8 pages.
(Continued)

*Primary Examiner* — Alexander C Kollias
(74) *Attorney, Agent, or Firm* — Lewis Roca Rothgerber Christie LLP

(57) ABSTRACT

An organic electroluminescence device includes a first electrode, a hole transport region on the first electrode, an emission layer on the hole transport region, an electron transport region on the emission layer, and a second electrode on the electron transport region, wherein the emission layer includes a polycyclic compound represented by Formula 1:

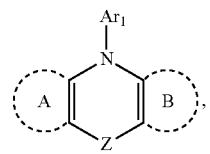

wherein in Formula 1, at least one selected from Ring A and Ring B is a substituted or unsubstituted heteroaryl group having 2 to 30 carbon atoms for forming a ring.

14 Claims, 2 Drawing Sheets

(51) Int. Cl.
  *C07F 5/02* (2006.01)
  *C09K 11/06* (2006.01)
  *H10K 50/11* (2023.01)
  *H10K 101/10* (2023.01)

(52) U.S. Cl.
  CPC ...... *C09K 2211/1018* (2013.01); *H10K 50/11* (2023.02); *H10K 2101/10* (2023.02)

(56) References Cited

U.S. PATENT DOCUMENTS

| | | | |
|---|---|---|---|
| 2003/0230980 A1* | 12/2003 | Forrest | H01L 51/5076 313/600 |
| 2006/0145599 A1* | 7/2006 | Stegamat | B82Y 30/00 313/503 |
| 2011/0278556 A1 | 11/2011 | Kottas et al. | |
| 2011/0279019 A1 | 11/2011 | Kottas et al. | |
| 2014/0042370 A1* | 2/2014 | Martynova | H01L 51/0071 546/37 |
| 2017/0194562 A1* | 7/2017 | Ji | H01L 51/008 |
| 2017/0309828 A1 | 10/2017 | Tanabe et al. | |
| 2018/0069182 A1 | 3/2018 | Hatakeyama et al. | |
| 2018/0094000 A1* | 4/2018 | Hatakeyama | H01L 51/0052 |
| 2018/0123057 A1 | 5/2018 | Yamatani | |
| 2018/0301629 A1 | 10/2018 | Hatakeyama et al. | |
| 2018/0366653 A1 | 12/2018 | He et al. | |
| 2019/0027694 A1 | 1/2019 | Hatakeyama et al. | |
| 2019/0058124 A1* | 2/2019 | Hatakeyama | H01L 51/008 |
| 2019/0115537 A1 | 4/2019 | Makishima et al. | |
| 2019/0256538 A1* | 8/2019 | Hatakeyama | H01L 51/0072 |
| 2020/0176679 A1 | 6/2020 | Jeong et al. | |

FOREIGN PATENT DOCUMENTS

| | | |
|---|---|---|
| CN | 107266484 A | 10/2017 |
| CN | 107417715 A | 12/2017 |
| CN | 107501311 A | 12/2017 |
| EP | 0 982 314 B1 | 5/2003 |
| EP | 3109253 A1 | 12/2016 |
| EP | 3 608 320 A1 | 2/2020 |
| EP | 3681972 A1 | 7/2020 |
| JP | 5724588 B2 | 5/2015 |
| JP | WO2015/102118 A1 | 3/2017 |
| JP | 2017-126606 A | 7/2017 |
| KR | 10-2015-0041508 A | 4/2015 |
| KR | 10-2017-0130434 A | 11/2017 |
| KR | 10-1886773 B1 | 8/2018 |
| WO | WO 2011/143563 A2 | 11/2011 |
| WO | WO 2012/149999 A1 | 11/2012 |
| WO | WO 2016/046350 A1 | 3/2016 |
| WO | WO 2016/152418 A1 | 9/2016 |
| WO | WO 2016/152544 A1 | 9/2016 |
| WO | WO 2017/092508 A1 | 6/2017 |
| WO | WO 2017/126443 A1 | 7/2017 |
| WO | WO 2017/138526 A1 | 8/2017 |
| WO | WO 2017/188111 A1 | 11/2017 |
| WO | WO 2017/195669 A1 | 11/2017 |
| WO | WO 2018/047639 A1 | 3/2018 |
| WO | 2018216990 A1 | 11/2018 |
| WO | 2019052939 A1 | 3/2019 |
| WO | WO 2019/164331 A1 | 8/2019 |

OTHER PUBLICATIONS

Mitsudo, Koichi et al.; Synthesis and Properties of Dithieno-Fused 1,4-Azaborine Derivatives, Organic Letters, ACS Publications, vol. 20, No. 22, dated Nov. 16, 2018, 5 pages.

Barraza, Scott J. et al., "Synthesis, Reactivity, Functionalization, and ADMET Properties of Silicon-Containing Nitrogen Heterocycles", *J. Am. Chem. Soc.* 2018, 140, pp. 6668-6684.

Nastase, Anthony F. et al., "Synthesis and Pharmacological Evaluation of Novel C-8 Substituted Tetrahydroquinolines as Balanced-Affinity Mu/Delta Opioid Ligands for the Treatment of Pain", *ACS Chem. Neurosci.* 2018, 9, pp. 1840-1848.

Schäfer, Marius et al., "Synthesis of Functionalized 1,4-Azaborinines by the Cyclization of Di-tert-butyliminoborane and Alkynes", *J. Am. Chem. Soc.* 2016, 138, pp. 8212-8220.

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0003819, filed on Jan. 11, 2019, the entire content of which is hereby incorporated by reference.

BACKGROUND

The present disclosure herein relates to an organic electroluminescence device and a heterocyclic compound used therefor.

Recently, the development of an organic electroluminescence display device as an image display device has been actively conducted. Unlike a liquid crystal display device, the organic electroluminescence display device is a self-luminescent display device in which holes and electrons injected from a first electrode and a second electrode are recombined in an emission layer, and a light emission material, which is an organic compound included in the emission layer, emits light to realize a display of images.

In the application of an organic electroluminescence device to a display device, the organic electroluminescence device is required to have a low driving voltage, a high luminous efficiency and a long life-time, and accordingly, development of materials for an organic electroluminescence device capable of stably (suitably) realizing the requirements is continuously required.

For example, to realize an organic electroluminescence device with high efficiency, in recent years, technology of phosphorescence emission using a triplet state energy or delayed fluorescence emission using triplet-triplet annihilation (TTA), which is a phenomenon of generating a singlet exciton by collision of a triplet exciton excitation, has been developed, and development of a thermally activated delayed fluorescence (TADF) material using the delayed fluorescence phenomenon is actively conducted.

SUMMARY

One or more aspects of embodiments of the present disclosure are directed toward an organic electroluminescence device having a long life-time and high efficiency, and a polycyclic compound used therefor.

Embodiments of the present disclosure are also directed toward an organic electroluminescence device including a thermally activated delayed fluorescence emission material, and a polycyclic compound used as a thermally activated delayed fluorescence emission material.

An embodiment of the inventive concept provides an organic electroluminescence device including: a first electrode; a hole transport region on the first electrode; an emission layer on the hole transport region; an electron transport region on the emission layer; and a second electrode on the electron transport region, wherein the emission layer includes a polycyclic compound represented by Formula 1:

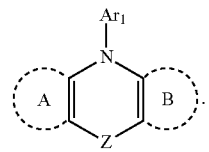

Formula 1

In Formula 1: Ring A and Ring B may each be independently a substituted or unsubstituted aryl group having 6 to 30 carbon atoms for forming a ring, or a substituted or unsubstituted heteroaryl group having 2 to 30 carbon atoms for forming a ring, and at least one selected from Ring A and Ring B may be a substituted or unsubstituted heteroaryl group having 2 to 30 carbon atoms for forming a ring; Z may be $BAr_2$, $POAr_3$, $PSAr_4$, $SiAr_5Ar_6$, or $GeAr_7Ar_8$; $Ar_1$ may be a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring; $Ar_2$ to $Ar_8$ may each be independently a substituted or unsubstituted amino group, a substituted or unsubstituted oxy group, a substituted or unsubstituted alkyl group having 1 to 10 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, wherein one or more selected from $Ar_2$ to $Ar_8$ may be combined with an adjacent group to form a ring.

At least one selected from Ring A and Ring B in Formula 1 may be represented by Formula 2:

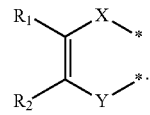

Formula 2

In Formula 2: X and Y may each independently be a direct bond, O, S, SO, $SO_2$, Se, $NR_3$, $PR_4$, $POR_5$, $PSR_6$, $SiR_7R_8$, $GeR_9R_{10}$, or $BR_{11}$, provided that X and Y may not both be a direct bond at the same time; and $R_1$ to $R_{11}$ may each independently be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, wherein one or more selected from $R_1$ to $R_{11}$ may be combined with an adjacent group to form a ring.

The emission layer may be an organic electroluminescence device configured to emit delayed fluorescence.

The emission layer may be a delayed fluorescence emission layer including a host and a dopant, wherein the dopant may be the polycyclic compound of Formula 1.

The emission layer may be a thermally activated delayed fluorescence emission layer configured to emit blue light.

Formula 1 may be represented by Formula 3:

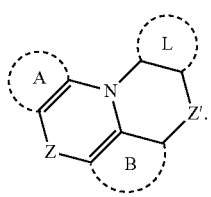

Formula 3

In Formula 3: Z' may be $BAr_2$, $POAr_3$, $PSAr_4$, $SiAr_5Ar_6$, or $GeAr_7Ar_8$; Ring L may be a substituted or unsubstituted aryl group having 6 to 30 carbon atoms for forming a ring, or a substituted or unsubstituted heteroaryl group having 2 to 30 carbon atoms for forming a ring; and Ring A, Ring B, and Z may be the same as defined in Formula 1.

In Formula 3, Z and Z' may be the same.

Formula 1 may be represented by Formula 4:

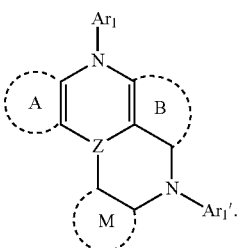

Formula 4

In Formula 4: Z may be B, PO, PS, $SiAr_5$, or $GeAr_7$; Ring M may be a substituted or unsubstituted aryl group having 6 to 30 carbon atoms for forming a ring, or a substituted or unsubstituted heteroaryl group having 2 to 30 carbon atoms for forming a ring; $Ar_1'$ may be a substituted or unsubstituted alkyl group having 1 to 10 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring; and Ring A, Ring B, $Ar_1$, $Ar_5$, and $Ar_7$ may be the same as defined in Formula 1.

In Formula 1, Z may be $BAr_2$.

Z may be represented by Formula 5:

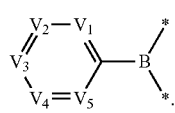

Formula 5

In Formula 5, $V_1$ to $V_5$ may each independently be $CR_{12}$ or N; $R_{12}$ may be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, wherein $R_{12}$ may be bonded to adjacent group to form a ring.

In Formula 5, $V_1$ to $V_5$ may each independently be $CR_{12}$, wherein $R_{12}$ may be a hydrogen atom, a deuterium atom, or a substituted or unsubstituted alkyl group having 2 to 10 carbon atoms.

In Formula 1, at least one selected from Ring A and Ring B may be substituted or unsubstituted pyrrole, substituted or unsubstituted thiophene, substituted or unsubstituted oxazine, or substituted or unsubstituted furan.

Formula 1 may be represented by Formula 6:

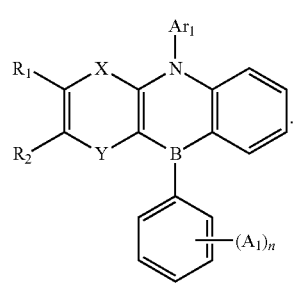

Formula 6

In Formula 6: $A_1$ may be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, wherein $A_1$ may be bonded to adjacent group to form a ring; n is an integer of 0 to 5; X and Y may each independently be a direct bond, O, S, SO, $SO_2$, Se, $NR_3$, $PR_4$, $POR_5$, $PSR_6$, $SiR_7R_8$, $GeR_9R_{10}$, or $BR_{11}$; $R_1$ to $R_{11}$ may each independently be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, wherein one or more selected from $R_1$ to $R_{11}$ may be combined with an adjacent group to form a ring; and $Ar_1$ may be the same as defined in Formula 1.

The polycyclic compound represented by Formula 1 may be selected from compounds collectively denoted as Compound Group 1.

One or more embodiments of the inventive concept provide a polycyclic compound represented by Formula 1.

BRIEF DESCRIPTION OF THE FIGURES

The accompanying drawings are included to provide a further understanding of the inventive concept, and are incorporated in and constitute a part of this specification.

The drawings illustrate example embodiments of the inventive concept and, together with the description, serve to explain principles of the inventive concept. In the drawings.

DETAILED DESCRIPTION

Figure 1:
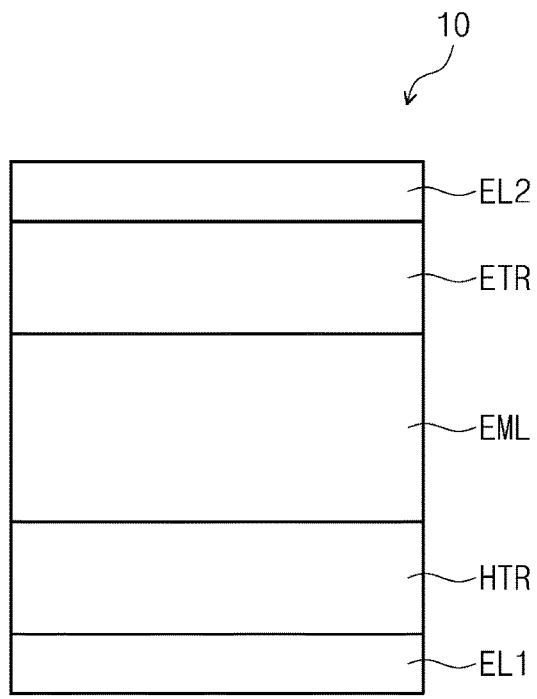
FIG. 1 is a cross-sectional view schematically illustrating an organic electroluminescence device according to an embodiment of the inventive concept.

The present inventive concept may have various modifications and may be embodied in different forms, and example embodiments will be explained in more detail with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

In the description, it should be understood that the terms "comprise," "include," and/or "have" intend to mean that there may be specified features, numerals, steps, operations, elements, parts, or combinations thereof, but do not exclude the possibility of the presence or addition of one or more other specified features, numerals, steps, operations, elements, parts, or combinations thereof. It will also be understood that when a layer, a film, a region, a plate, etc. is referred to as being "on" another part, it can be "directly on" the other part, or intervening parts may also be present. Conversely, when a layer, a film, a region, a plate, etc. is referred to as being "directly on" another part, no intervening parts may be present.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

Hereinafter, an organic electroluminescence device according to an embodiment of the inventive concept will be explained with reference to FIGS. 1 to 3.

Figure 2:
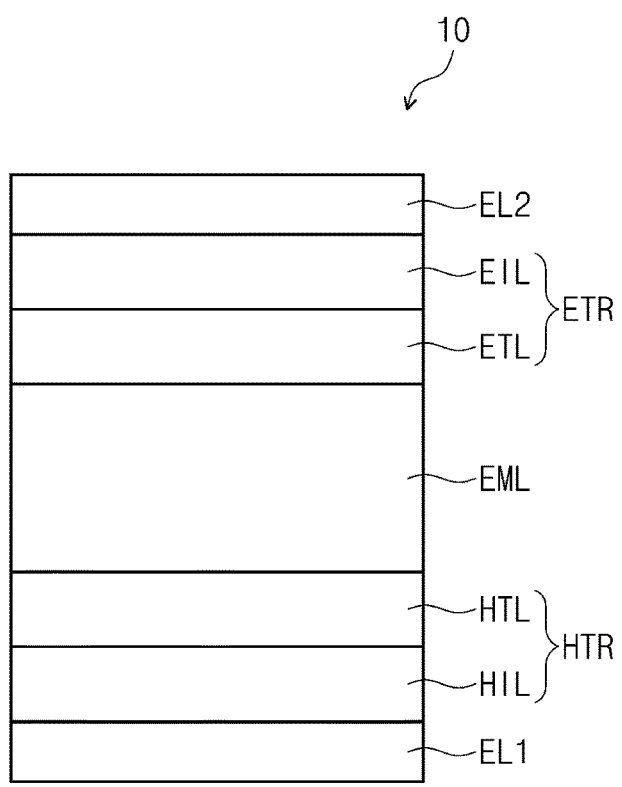
FIG. 2 is a cross-sectional view schematically illustrating an organic electroluminescence device according to an embodiment of the inventive concept.
Figure 3:
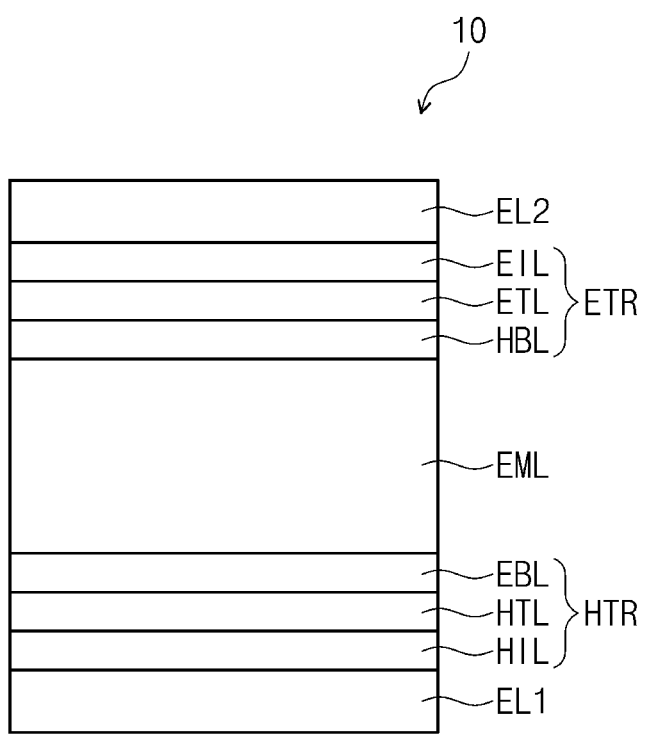
FIG. 3 is a cross-sectional view schematically illustrating an organic electroluminescence device according to an embodiment of the inventive concept.

Referring to FIGS. 1 to 3, an organic electroluminescence device 10 according to an embodiment may include a first electrode EL1, a hole transport region HTR, an emission layer EML, an electron transport region ETR, and a second electrode EL2, which are sequentially laminated.

The first electrode EL1 and the second electrode EL2 may be disposed (e.g., positioned or located) to face each other, and a plurality of organic layers may be disposed between the first electrode EL1 and the second electrode EL2. The plurality of organic layers may include a hole transport region HTR, an emission layer EML, and an electron transport region ETR. The organic electroluminescence device 10 may include a polycyclic compound of embodiments of the present disclosure in the emission layer EML.

Compared with FIG. 1, FIG. 2 illustrates a cross-sectional view of an organic electroluminescence device 10 according to an embodiment, wherein a hole transport region HTR includes a hole injection layer HIL and a hole transport layer HTL, and an electron transport region ETR includes an electron injection layer EIL and an electron transport layer ETL. In addition, compared with FIG. 1, FIG. 3 illustrates a cross-sectional view of an organic electroluminescence device 10 according to an embodiment, wherein a hole transport region HTR includes a hole injection layer HIL, a hole transport layer HTL and an electron blocking layer EBL, and an electron transport region ETR includes an electron injection layer EIL, an electron transport layer ETL and a hole blocking layer HBL.

In an organic electroluminescence device 10 of one or more embodiments, the first electrode EL1 may have conductivity. The first electrode EL1 may be formed of a metal alloy or a conductive compound. The first electrode EL1 may be an anode.

The first electrode EL1 may be a transmissive electrode, a transflective electrode, or a reflective electrode. When the first electrode EL1 is a transmissive electrode, the first electrode EL1 may be formed of a transparent metal oxide, for example, indium tin oxide (ITO), indium zinc oxide (IZO), zinc oxide (ZnO), indium tin zinc oxide (ITZO), etc. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or mixture thereof (for example, a mixture of Ag and Mg). In one or more embodiments, the first electrode EL1 may have a structure which has a plurality of layers including: a reflective layer or a transflective layer formed of any of the described materials; and a transparent conductive layer formed of ITO, IZO, ZnO, ITZO, etc. For example, the first electrode EL1 may have a multi-layer structure of ITO/Ag/ITO.

The hole transport region HTR may be disposed on the first electrode EL1. The hole transport region HTR may include at least one selected from a hole injection layer HIL, a hole transport layer HTL, a hole buffer layer, and an electron blocking layer EBL.

The hole transport region HTR may have a structure of: a single layer formed of a single material; a single layer formed of a plurality of different materials; or a multi-layer having a plurality of layers formed of a plurality of different materials.

For example, the hole transport region HTR may have a structure of a single layer which is a hole injection layer HIL or a hole transport layer HTL, or may have a structure of a single layer formed of a hole injection material and a hole transport material. In one or more embodiments, the hole transport region HTR may have a structure of a single layer formed of a plurality of different materials, or may have a structure of, sequentially laminated from the first electrode EL1, hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, but embodiments are not limited thereto.

The hole transport region HTR may be formed by using one or more suitable methods such as a vacuum deposition method, a spin coating method, a casting method, a Langmuir-Blodgett (LB) method, an inkjet printing method, a laser printing method, and/or a laser induced thermal imaging (LITI) method.

The hole injection layer HIL of an organic electroluminescence device 10 of one or more embodiments may include any suitable hole injection material, for example, triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4"-tris(3-methyl-phenyl-phenylamino)-triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4"-tris(N,N-diphenyl-amino)-triphenylamine (TDATA), 4,4',4"-tris(N,N-2-naphthyl-phenylamino)-triphenylamine (2-TNATA), polyaniline/dodecyl benzene sulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), dipyrazino[2,3-f:2',3'-h]quinoxaline-2,3,6,7,10,11-hexacarbonitrile (HAT-CN), etc., but embodiments of the present disclosure are not limited thereto.

The hole transport layer HTL of an organic electroluminescence device 10 of one or more embodiments may include any suitable hole transport material, for example, 1,1-bis[(di-4-tolylamino)phenyl]cyclohexane (TAPC), a carbazole derivative such as N-phenylcarbazole or polyvinylcarbazole, N,N'-bis(3-methylphenyl)-N,N'-diphenyl-(1,1-biphenyl)-4,4'-diamine (TPD), 4,4',4"-tris(N-carbazolyl) triphenylamine (TCTA), N,N'-di(1-naphthyl)-N,N'-diphenylbenzidine (NPB), N,N'-bis(1-naphthyl)-N,N'-diphenyl-4,4'-diamine (α-NPD), etc., but embodiments of the present disclosure are not limited thereto.

The hole transport region HTR may further include an electron blocking layer EBL, and the electron blocking layer EBL may be disposed between the hole transport layer HTL and the emission layer EML. The electron blocking layer EBL may serve to prevent or reduce electron injection from the electron transport region ETR to the hole transport region HTR.

The electron blocking layer EBL may include any suitable material, for example, a carbazole-based derivative such as N-phenylcarbazole and/or polyvinylcarbazole, a fluorine-based derivative, a triphenylamine-based derivative such as N,N'-bis(3-methylphenyl)-N,N'-diphenyl-(1,1-biphenyl)-4,4'-diamine (TPD) and/or 4,4',4"-tris(N-carbazolyl)triphenylamine (TCTA), N,N'-di(naphthalene-1-yl)-N,N'-diphenyl-benzidine (NPB), 4,4'-cyclohexylidene-bis[N,N-bis(4-methylphenyl)benzenamine] (TAPC), 4,4'-bis[N,N'-(3-tolyl)amino]-3,3'-dimethylbiphenyl (HMTPD), mCP, etc., and the electron blocking layer EBL may also include the polycyclic compound according to embodiments of the inventive concept as described herein.

A thickness of the hole transport region HTR may be about 100 to about 10000 Å, for example, about 100 to about 5000 Å. A thickness of the hole injection layer HIL may be, for example, about 30 to about 1000 Å, and a thickness of the hole transport layer HTL may be about 10 to about 1000 Å. For example, a thickness of the electron blocking layer EBL may be about 10 to about 1000 Å. When the thicknesses of the hole transport region HTR, the hole injection layer HIL, the hole transport layer HTL and the electron blocking layer EBL satisfy any of the described ranges, satisfactory (or suitable) hole transport performance may be achieved without substantial rise of a driving voltage.

The hole transport region HTR may further include, in addition to the described materials, a charge generating material to improve conductivity. The charge generating material may be uniformly or nonuniformly dispersed in the hole transport region HTR. The charge generating material may be, for example, a p-dopant. The p-dopant may be selected from a quinone derivative, a metal oxide, and a cyano group-containing compound, but embodiments of the present disclosure are not limited thereto. The non-limited examples of the p-dopant may be, for example, a quinone derivative (such as tetracyanoquinodimethane (TCNQ) and/or 2,3,5,6-tetrafluoro-tetracyanoquinodimethane (F4-TCNQ)), a metal oxide (such as tungsten oxide and/or molybdenum oxide), etc., but embodiments of the present disclosure are not limited thereto.

The hole transport region HTR may further include at least one selected from the hole buffer layer and the electron blocking layer EBL, in addition to the hole injection layer HIL and the hole transport layer HTL. The hole buffer layer may improve luminous efficiency by compensating a resonance distance according to the wavelength of the light emitted from the emission layer EML. Any of the materials contained in the hole transport region HTR may also be used as materials contained in the hole buffer layer.

The emission layer EML may be disposed on the hole transport region HTR. The emission layer EML may have a thickness of, for example, about 100 to about 600 Å. The emission layer EML may have a structure of: a single layer formed of a single material; a single layer formed of a plurality of different materials; or a multi-layer having a plurality of layers formed of a plurality of different materials.

The emission layer EML may emit one selected from red light, green light, blue light, white light, yellow light, and cyan light. The emission layer EML may include a fluorescence emission material and/or a phosphorescence emission material.

In one or more embodiments, the emission layer EML may be a fluorescence emission layer. For example, some of the lights emitted from the emission layer EML may be emitted by thermally activated delayed fluorescence (TADF). For example, the emission layer EML may include emission components which emit thermally activated delayed fluorescence, and in one or more embodiments, the emission layer EML may be an emission layer which emits thermally activated delayed fluorescence of blue light.

In the present description, -* may refer to a connecting position.

In the present description, the term "substituted or unsubstituted" may refer to a group that is unsubstituted or is substituted with at least one substituent selected from a deuterium atom, a halogen atom, a cyano group, a silyl group, an oxy group, a thio group, an alkyl group, an alkoxy group, a hydrocarbon ring group, an aryl group, and a heterocyclic group. In addition, each of the substituents exemplified above may itself be substituted or unsubstituted. For example, a biphenyl group may be an aryl group or a phenyl group substituted with a phenyl group.

In the present description, the expression "forming a ring via the combination with an adjacent group" may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle (or heterocyclic group) includes an aliphatic heterocycle and an aromatic heterocycle. The ring formed by the combination with an adjacent group may be a monocyclic ring or a polycyclic ring. In addition, the ring formed via the combination may be combined with another ring to form a spiro structure.

In the present description, the term "adjacent group" may refer to a pair of substituent groups where the first substituent is connected to an atom which is directly connected with another atom substituted with the second substituent, a pair of substituent groups connected to the same atoms (where the pair of substituent groups may be different from each other), or a pair of substituent groups where the first substituent is sterically positioned at the nearest position to the second substituent. For example, in 1,2-dimethylbenzene, two methyl groups may be "adjacent groups" to each other, and in 1,1-diethylcyclopentene, two ethyl groups may be "adjacent groups" to each other.

In the present description, "atoms for forming a ring" may refer to ring-forming atoms.

In the present description, the halogen atom may be, for example, a fluorine atom, a chlorine atom, a bromine atom, and/or an iodine atom.

In the present description, the alkyl group may be a linear, branched, or cyclic type. The carbon number of the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

In the present description, the aryl group may refer to an aromatic hydrocarbon ring functional group or substituent. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc., but embodiments of the present disclosure are not limited thereto.

In the present description, the fluorenyl group may be substituted, and two substituents may optionally be combined with each other to form a spiro structure. Examples of a substituted fluorenyl group are as follows, but embodiments of the present disclosure are not limited thereto:

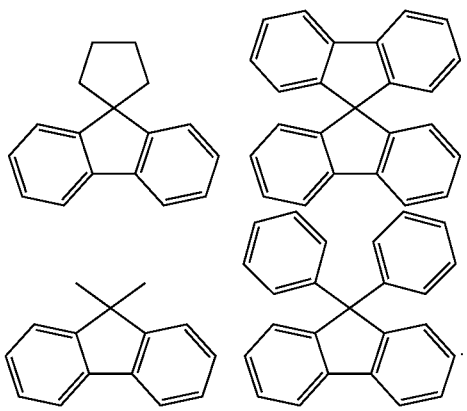

In the present description, the heteroaryl group may be a cyclic aromatic group including one or more of O, N, P, Si, or S as a ring-forming heteroatom. The number of ring-forming carbon atoms in the heteroaryl group may be 2 to 30 or 2 to 20. The heteroaryl group may be a monocyclic heteroaryl group or a polycyclic heteroaryl group. The polycyclic heteroaryl group may have, for example, a bicyclic structure or a tricyclic structure. Examples of the heteroaryl group may include a thiophenyl group, a furanyl group, a pyrrolyl group, an imidazolyl group, a thiazolyl group, an oxazolyl group, an oxadiazolyl group, a triazolyl group, a pyridyl group, a bipyridyl group, a pyrimidyl group, a triazinyl group, an acridyl group, a pyridazinyl group, a pyrazinyl group, a quinolinyl group, a quinazolinyl group, a quinoxalinyl group, a phenoxazyl group, a phthalazinyl group, a pyrido pyrimidinyl group, a pyrido pyrazinyl group, a pyrazino pyrazinyl group, an isoquinolinyl group, indolyl group, a carbazolyl group, an N-arylcarbazolyl group, an N-heteroarylcarbazolyl group, an N-alkylcarbazolyl group, a benzoxazolyl group, a benzoimidazolyl group, a benzothiazolyl group, a benzocarbazolyl group, a benzothiophenyl group, a dibenzothiophenyl group, a thienothiophenyl group, a benzofuranyl group, a phenanthrolinyl group, a thiazolyl group, an isooxazolyl, an oxadiazolyl group, a thiadiazolyl group, a benzothiazolyl group, a phenothiazinyl group, a dibenzosilolyl group, a dibenzofuranyl group, etc., but embodiments of the present disclosure are not limited thereto.

In the present description, the silyl group includes an alkylsilyl group and an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but embodiments of the present disclosure are not limited thereto.

In the present description, the carbon number of the amine group is not particularly limited, but may be 1 to 30. The amine group may include an alkylamine group and an arylamine group. Examples of the amine group may include a methylamine group, a dimethylamine group, a phenylamine group, a naphthylamine group, a 9-methyl-anthracenylamine group, a triphenylamine group, etc., but embodiments of the present disclosure are not limited thereto.

In one or more embodiments, the emission layer EML may include a polycyclic compound represented by Formula 1:

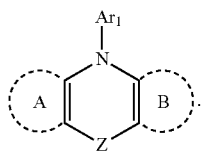

Formula 1

In Formula 1, Ring A and Ring B may each independently be a substituted or unsubstituted aryl group having 6 to 30 carbon atoms for forming a ring, or a substituted or unsubstituted heteroaryl group having 2 to 30 carbon atoms for forming a ring.

In Formula 1, at least one selected from Ring A and Ring B may be a substituted or unsubstituted heteroaryl group having 2 to 30 carbon atoms for forming a ring. In contrast, when both Ring A and Ring B are not heteroaryl groups, molecular stability may be lowered, thereby deteriorating luminous efficiency and/or life-time of an organic electroluminescence device in which the polycyclic compound is used.

In Formula 1, Z may be $BAr_2$, $POAr_3$, $PSAr_4$, $SiAr_5Ar_6$, or $GeAr_7Ar_8$.

In Formula 1, $Ar_1$ may be a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring.

In Formula 1, $Ar_2$ to $Ar_8$ may each independently be a substituted or unsubstituted amino group, a substituted or unsubstituted oxy group, a substituted or unsubstituted alkyl group having 1 to 10 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, and one or more selected from $Ar_2$ to $Ar_8$ may be combined with an adjacent group to form a ring.

In one or more embodiments, at least one selected from Ring A and Ring B in Formula 1 may be represented by Formula 2:

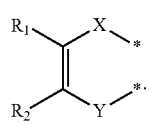

Formula 2

In Formula 2, X and Y may each independently be a direct bond, O, S, SO, $SO_2$, Se, $NR_3$, $PR_4$, $POR_5$, $PSR_6$, $SiR_7R_8$, $GeR_9R_{10}$, or $BR_{11}$.

In Formula 2, $R_1$ to $R_{11}$ may each independently be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, and one or more selected from $R_1$ to $R_{11}$ may be combined with an adjacent group to form a ring.

Formula 2 represents an embodiment in which one selected from Ring A and Ring B in Formula 1 is a heteroaryl ring (heteroaryl group), and a case in which X and Y in Formula 2 are both direct bonds at the same time is excluded.

In one or more embodiments, $Ar_1$ in Formula 1 may be a substituted or unsubstituted aryl group having 6 to 30 carbon atoms for forming a ring, or a substituted or unsubstituted heteroaryl group having 2 to 30 carbon atoms for forming a ring, and $Ar_1$ may be combined with an adjacent group to form a ring.

In one or more embodiments, when $Ar_1$ in Formula 1 is an aryl group or a heteroaryl group which is bonded to an adjacent group to form a ring, Formula 1 may be represented by Formula 3:

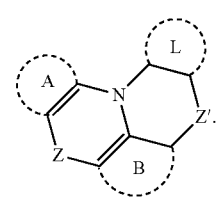

Formula 3

In Formula 3, Z' may be $BAr_2$, $POAr_3$, $PSAr_4$, $SiAr_5Ar_6$, or $GeAr_7Ar_8$.

In Formula 3, Ring L may be a substituted or unsubstituted aryl group having 6 to 30 carbon atoms for forming a ring, or a substituted or unsubstituted heteroaryl group having 2 to 30 carbon atoms for forming a ring.

In Formula 3, Ring A, Ring B, and Z may be the same as defined in Formula 1.

In one or more embodiments, Z and Z' in Formula 3 may be the same as each other.

In one or more embodiments, $Ar_2$ to $Ar_8$ in Formula 1 may each independently be a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, and one or more selected from $Ar_2$ to $Ar_8$ may be combined with an adjacent group to form a ring.

In one or more embodiments, when $Ar_2$ to $Ar_8$ in Formula 1 are each independently an aryl or a heteroaryl group which is bonded to an adjacent group to form a ring, Formula 1 may be represented by Formula 4:

Formula 4

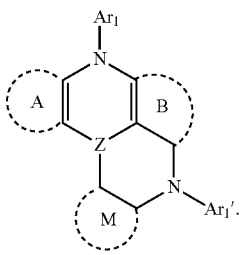

In Formula 4, Z may be B, PO, PS, SiAr$_5$, or GeAr$_7$.

In Formula 4, Ring M may be a substituted or unsubstituted aryl group having 6 to 30 carbon atoms for forming a ring, or a substituted or unsubstituted heteroaryl group having 2 to 30 carbon atoms for forming a ring.

In Formula 4, Ar$_1$' may be a substituted or unsubstituted alkyl group having 1 to 10 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring.

In Formula 4, Ring A, Ring B, Ar$_1$, Ar$_5$, and Ar$_7$ may be the same as defined in Formula 1.

In one or more embodiments, Z in Formula 1 may be BAr$_2$.

In one or more embodiments, when Z in Formula 1 is BAr$_2$, Z may be represented by Formula 5:

Formula 5

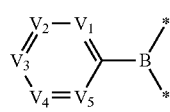

In Formula 5, V$_1$ to V$_5$ may each independently be CR$_{12}$ or N. At least one selected from V$_1$ to V$_5$ may be CR$_{12}$.

In Formula 5, R$_{12}$ may be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, and one or more R$_{12}$ may be bonded to adjacent group to form a ring.

In one or more embodiments, V$_1$ to V$_5$ in Formula 5 may each independently be CR$_{12}$, wherein R$_{12}$ may be a hydrogen atom, a deuterium atom, or a substituted or unsubstituted alkyl group having 2 to 10 carbon atoms.

In one or more embodiments, at least one selected from Ring A and Ring B in Formula 1 may be substituted or unsubstituted pyrrole, substituted or unsubstituted thiophene, substituted or unsubstituted oxazine, or substituted or unsubstituted furan.

In one or more embodiments, Formula 1 may be represented by Formula 6:

Formula 6

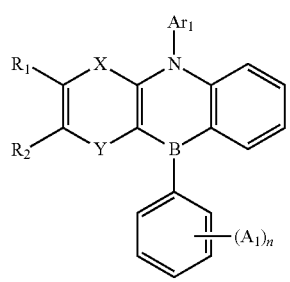

In Formula 6, A$_1$ may be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, and one or more A$_1$ may be bonded to adjacent group to form a ring.

In Formula 6, n may be an integer of 0 to 5. When n is 2 or larger, a plurality of A$_1$s may be the same as or different from each other.

In Formula 6, X and Y may each independently be a direct bond, O, S, SO, SO$_2$, Se, NR$_3$, PR$_4$, POR$_5$, PSR$_6$, SiR$_7$R$_8$, GeR$_9$R$_{10}$, or BR$_{11}$.

In Formula 6, R$_1$ to R$_{11}$ may each independently be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, and one or more selected from R$_1$ to R$_{11}$ may be combined with an adjacent group to form a ring.

In Formula 6, Ar$_1$ may be the same as defined in Formula 1.

The polycyclic compound of the present embodiments represented by Formula 1 may be a delayed fluorescence emission material. The polycyclic compound of the present embodiments may be a thermally activated delayed fluorescence material.

For example, the polycyclic compound represented by Formula 1 may have a small difference between a singlet energy level (S1) and a triplet energy level (T1), thereby being used as a thermally activated delayed fluorescence material. The polycyclic compound of an embodiment represented by Formula 1 may be represented by any one selected from the compounds in Compound Group 1:
Compound Group 1
1
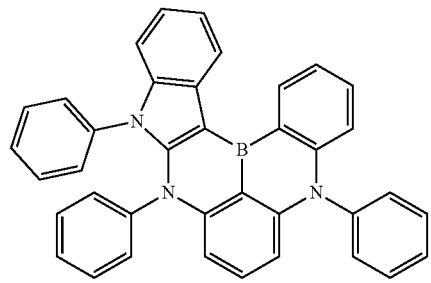
2
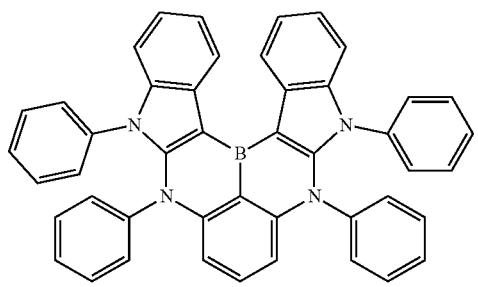
3
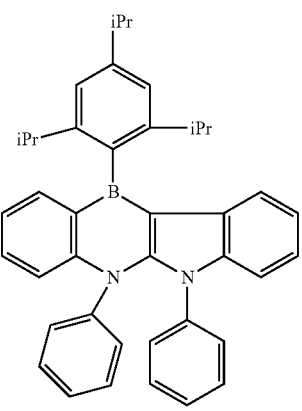
4
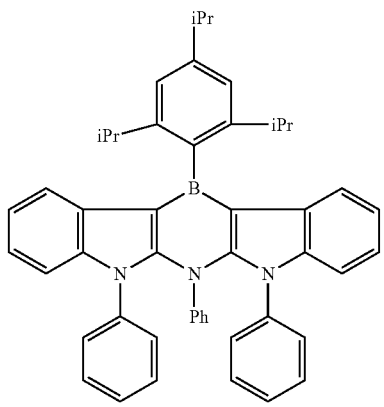
-continued
5
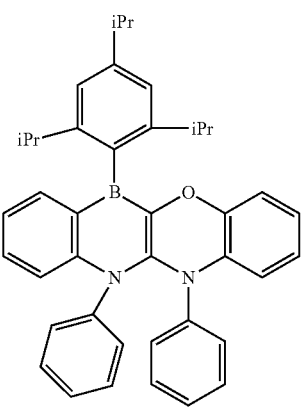
6
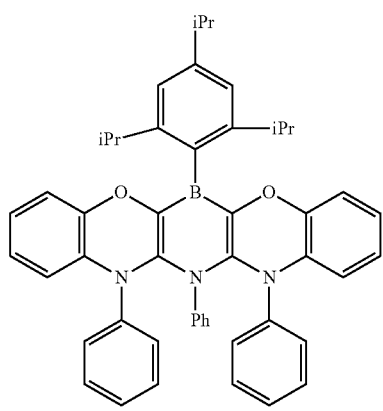
7
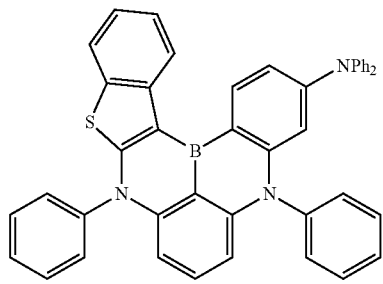
8
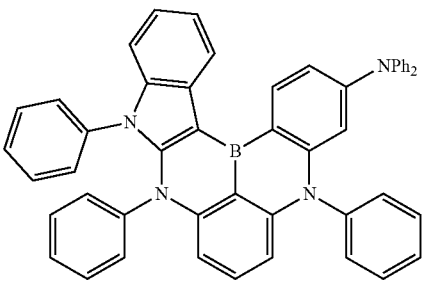
9
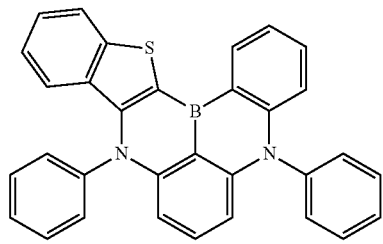

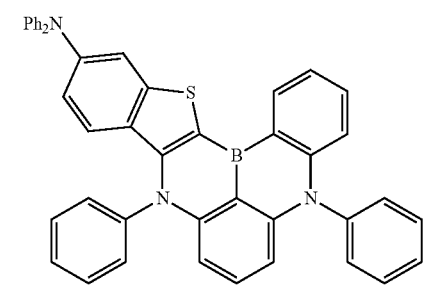
10
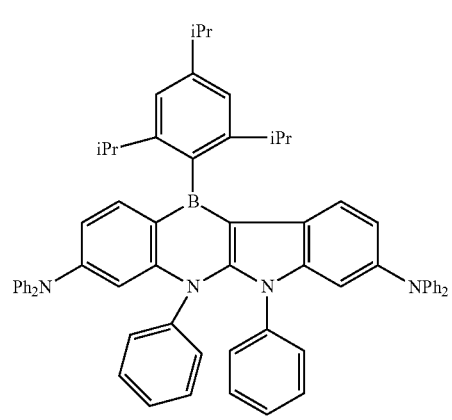
11
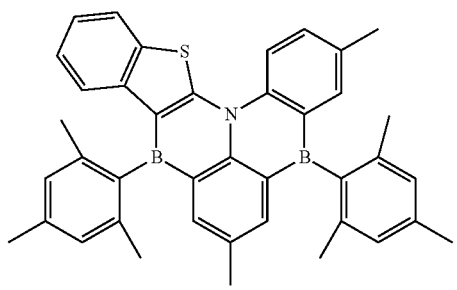
12
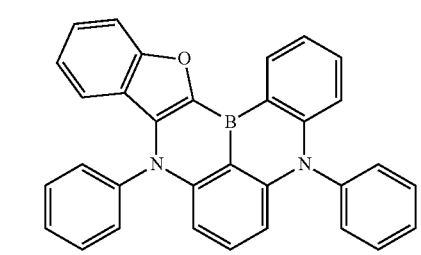
13
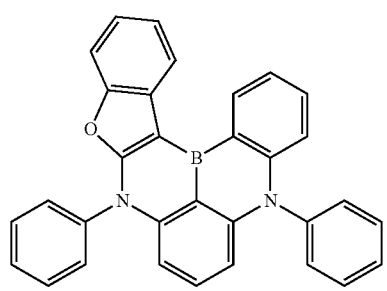
14
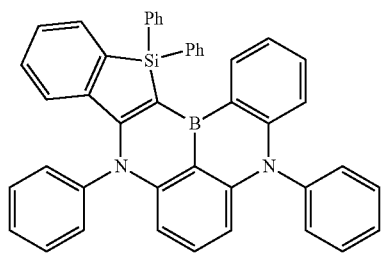
15
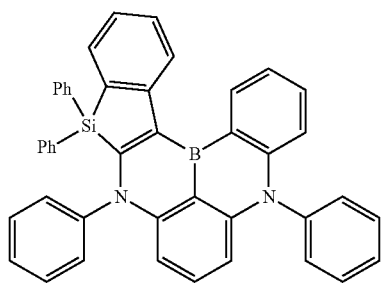
16
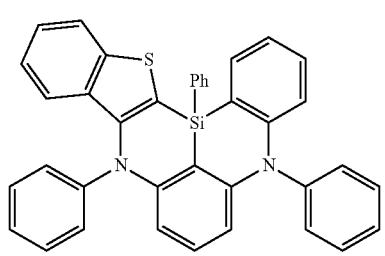
17
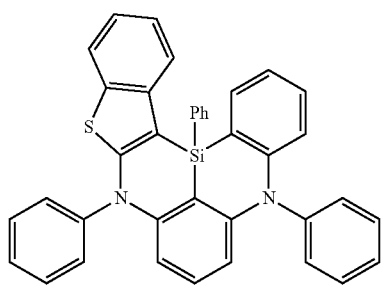
18
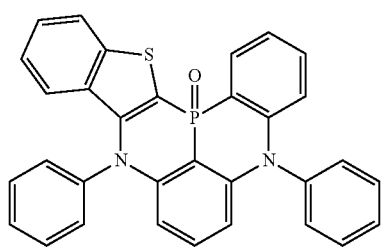
19
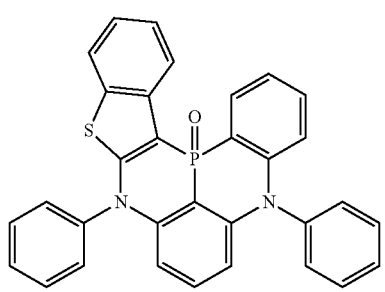
20

21

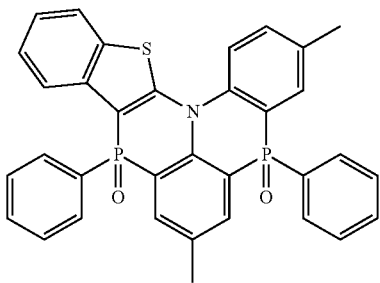

22

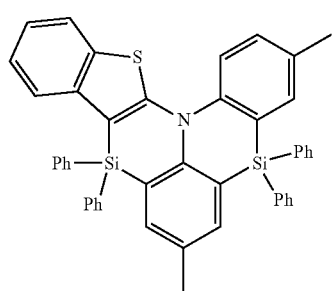

23

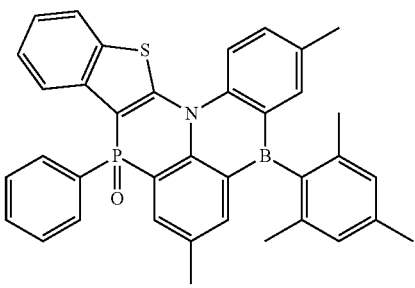

24

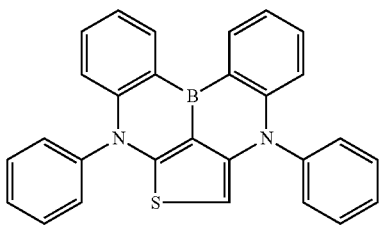

25

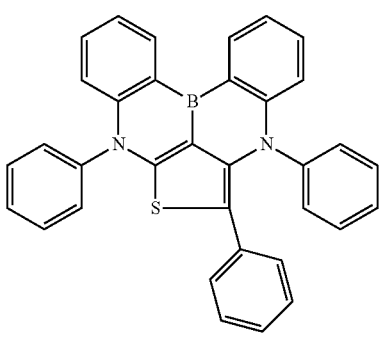

26

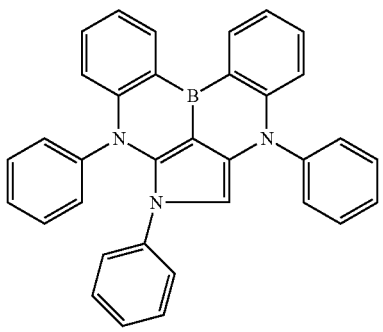

27

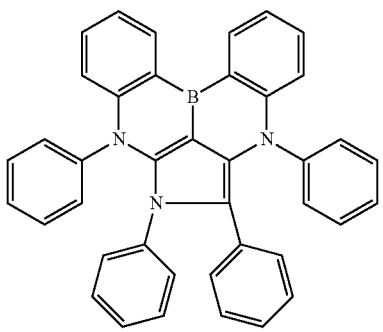

The described polycyclic compound represented by Formula 1 may be used in the organic electroluminescence device 10 of one or more embodiments to improve the efficiency and/or life-time of the organic electroluminescence device. For example, the described polycyclic compound represented by Formula 1 may be used in the emission layer EML of the organic electroluminescence device 10 to improve the luminous efficiency and/or life-time of the organic electroluminescence device.

In one or more embodiments, the emission layer EML may include a host and a dopant, and the host may be for delayed fluorescence emission and the dopant may be for delayed fluorescence emission. The polycyclic compound represented by Formula 1 may be contained (included) as a dopant material in the emission layer EML. For example, the polycyclic compound represented by Formula 1 may be used as a TADF dopant.

In one or more embodiments, the emission layer EML may include any suitable host material, for example, tris(8-hydroxyquinolino)aluminum ($Alq_3$), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. However, embodiments of the present disclosure are not limited thereto, and in addition to the described host materials, any suitable delayed fluorescence emission host material may be contained (included).

Furthermore, the emission layer EML of the organic electroluminescence device 10 of the present embodiments may include any suitable dopant material, for example, a styryl derivative (such as 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or a derivative thereof (such as 2,5,8,11-tetra-t-butylperylene (TBP)), pyrene and/or a derivative thereof (such as 1,1-dipyrene, 1,4-dipyrenylbenzene, and/or 1,4-bis(N,N-diphenylamino)pyrene), etc.

Referring to FIGS. 1 to 3 again, in the organic electroluminescence device 10 of an embodiment, the electron transport region ETR may be disposed on the emission layer EML. The electron transport region ETR may include at least one selected from a hole blocking layer HBL, an electron transport layer ETL, and an electron injection layer EIL, but embodiments of the present disclosure are not limited thereto.

The electron transport region ETR may have a structure of: a single layer formed of a single material; a single layer formed of a plurality of different materials; or a multi-layer having a plurality of layers formed of a plurality of different materials.

For example, the electron transport region ETR may have a structure of a single layer which is an electron injection layer EIL or an electron transport layer ETL, or may have a structure of a single layer formed of an electron injection material and an electron transport material. In one or more embodiments, the electron transport region ETR may have a structure of a single layer formed of a plurality of different materials, or may have a structure of, sequentially laminated from the first electrode EL1, electron transport layer ETL/electron injection layer EIL or hole blocking layer HBL/electron transport layer ETL/electron injection layer EIL, but embodiments of the present disclosure are not limited thereto. A thickness of the electron transport region ETR may be, for example, from about 100 to about 1500 Å.

The electron transport region ETR may be formed using one or more suitable methods such as a vacuum deposition method, a spin coating method, a casting method, a Langmuir-Blodgett (LB) method, an inkjet printing method, a laser printing method, and/or a laser induced thermal imaging (LITI) method.

When the electron transport region ETR includes the electron transport layer ETL, the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) ($Bebq_2$), and/or 9,10-di(naphthalene-2-yl)anthracene (ADN), but embodiments of the present disclosure are not limited thereto.

When the electron transport region ETR includes the electron transport layer ETL, a thickness of the electron transport layer ETL may be about 100 to about 1000 Å, for example, about 150 to about 500 Å. When the thickness of the electron transport layer ETL satisfies the described range, satisfactory (or suitable) electron transport performance may be achieved without substantial rise of a driving voltage.

When the electron transport region ETR includes the electron injection layer EIL, the electron transport region ETR may include, for example, a halogenated metal such as LiF, NaCl, CsF, RbCl, RbI, and/or KI, a lanthanide metal such as Yb, a metal oxide such as $Li_2O$, BaO, and/or lithium quinolate (LiQ), and/or the like, but embodiments of the present disclosure are not limited thereto. The electron injection layer EIL may also be formed of a mixture of an electron transport material and an insulating organo-metal salt. The organo-metal salt may be a material having an energy band gap of about 4 eV or more. In one or more embodiments, the organo-metal salt may contain, for example, a metal acetate, a metal benzoate, a metal acetoacetate, a metal acetylacetonate, and/or a metal stearate.

When the electron transport region ETR includes the electron injection layer EIL, a thickness of the electron injection layer EIL may be about 1 to about 100 Å or about 3 to about 90 Å. When the thickness of the electron injection layer EIL satisfies the described range, satisfactory (or suitable) electron injection performance may be achieved without substantial rise of a driving voltage.

The electron transport region ETR may include a hole blocking layer HBL as described above. The hole blocking layer HBL may include, for example, at least one selected from 2,9-dimethyl-4,7-diphenyl-1,10-phenanthroline (BCP) and 4,7-diphenyl-1,10-phenanthroline (Bphen), but embodiments of the present disclosure are not limited thereto.

The second electrode EL2 may be disposed on the electron transport region ETR. The second electrode EL2 may have conductivity. The second electrode EL2 may be formed of a metal alloy and/or a conductive compound. The second electrode EL2 may be a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or mixture thereof (for example, a mixture of Ag and Mg). In one or more embodiments, the second electrode EL2 may be a structure which has a plurality of layers including: a reflective layer or a transflective layer formed of any of the described materials; and a transparent conductive layer formed of ITO, IZO, ZnO, ITZO, etc.

In one or more embodiments, the second electrode EL2 may be connected to an auxiliary electrode. When the second electrode EL2 is connected to the auxiliary electrode, the resistance of the second electrode EL2 may be reduced.

In the organic electroluminescence device 10, as a voltage is applied to the first electrode EL1 and the second electrode EL2 respectively, the holes injected from the first electrode EL1 may move through the hole transport region HTR to the emission layer EML, and the electrons injected from the second electrode EL2 may move through the electron transport region ETR to the emission layer EML. The electrons and the holes may be recombined in the emission layer EML to generate excitons, and the excitons may emit light when the excitons fall back from an excited state to a ground state.

When the organic electroluminescence device 10 is a top emission type (e.g., a top emission organic electroluminescence device), the first electrode EL1 may be a reflective electrode and the second electrode EL2 may be a transmissive electrode or a transflective electrode. When the organic electroluminescence device 10 is a bottom emission type (e.g., bottom emission organic electroluminescence device), the first electrode EL1 may be a transmissive electrode or a transflective electrode and the second electrode EL2 may be a reflective electrode.

The organic electroluminescence device according to one or more embodiments of the inventive concept may exhibit improved luminous efficiency and life-time characteristics using the described polycyclic compound of the present embodiments as an emission layer material.

An embodiment of the inventive concept provides a polycyclic compound represented by Formula 1:

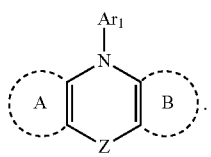

Formula 1

In Formula 1, Ring A and Ring B may each independently be a substituted or unsubstituted aryl group having 6 to 30 carbon atoms for forming a ring, or a substituted or unsubstituted heteroaryl group having 2 to 30 carbon atoms for forming a ring.

In Formula 1, at least one selected from Ring A and Ring B may be a substituted or unsubstituted heteroaryl group having 2 to 30 carbon atoms for forming a ring. In contrast, when both Ring A and Ring B are not heteroaryl groups, molecular stability may be lowered, thereby deteriorating luminous efficiency and/or life-time when the polycyclic compound is applied to an organic electroluminescence device.

In Formula 1, Z may be $BAr_2$, $POAr_3$, $PSAr_4$, $SiAr_5Ar_6$, or $GeAr_7Ar_8$.

In Formula 1, $Ar_1$ may be a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring.

In Formula 1, $Ar_2$ to $Ar_8$ may each independently be a substituted or unsubstituted amino group, a substituted or unsubstituted oxy group, a substituted or unsubstituted alkyl group having 1 to 10 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, and one or more selected from $Ar_2$ to $Ar_8$ may be combined with an adjacent group to form a ring.

In one or more embodiments, at least one selected from Ring A and Ring B in Formula 1 may be represented by Formula 2:

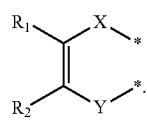

Formula 2

In Formula 2, X and Y may each independently be a direct bond, O, S, SO, $SO_2$, Se, $NR_3$, $PR_4$, $POR_5$, $PSR_6$, $SiR_7R_8$, $GeR_9R_{10}$, or $BR_{11}$.

In Formula 2, $R_1$ to $R_{11}$ may each independently be a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, and one or more selected from $R_1$ to $R_{11}$ may be combined with an adjacent group to form a ring.

Formula 2 represents an embodiment in which one selected from Ring A and Ring B in Formula 1 is a heteroaryl group, and a case in which X and Y in Formula 2 are both directly bonds at the same time is excluded.

The description for the polycyclic compound provided above in connection with the organic electroluminescence device of the present embodiments may be equally applied to the polycyclic compound represented by Formula 1 of this embodiment.

The polycyclic compound according to the embodiment may be any one selected from the compounds collectively denoted as the Compound Group 1.

Hereinafter, the inventive concept will be explained in more detail with reference to Examples and Comparative Examples. However, the following embodiments are only examples intended to assist in understanding of the inventive concept, and the scope of the inventive concept is not limited thereto.

Synthesis Example

A monoamine compound according to an embodiment of the inventive concept may be synthesized, for example, as following examples. However, the synthesis method of the monoamine compound according to an embodiment of the inventive concept is not limited thereto.

1. Synthesis of Compound 8

A monoamine Compound 8 according to an embodiment of the inventive concept may be synthesized, for example, as follows:

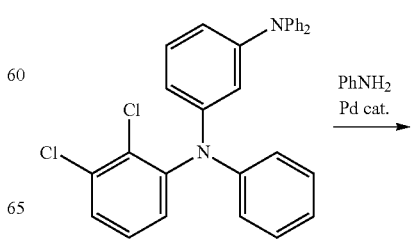

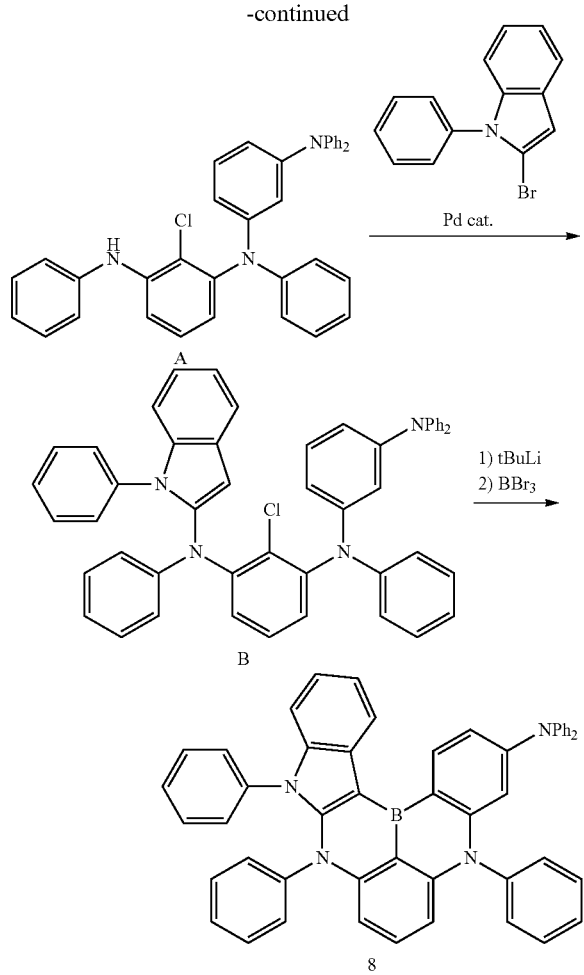

Synthesis of Intermediate Compound A

N¹-(2,3-dichlorophenyl)-N¹,N³,N³-triphenyl-1,3-benzenediamine 9.63 g (20 mmol), aniline 2.0 mL (22 mmol), (Amphos)PdCl$_2$ 0.71 g (1.0 mmol), and NaOtBu 2.11 g (22 mmol) were added to a 300 mL three-neck flask under Ar atmosphere, and the mixture was stirred at 120° C. for 1 hour in a 100 mL xylene solvent. After air cooling, water was added thereto to separate the organic layer, and the solvent was distilled off. The obtained crude product was purified by column chromatography (silica gel) to obtain 7.40 g of Compound A (yield of 69%) as a white solid. The molecular weight of Compound A measured by Fast Atom Bombardment-Mass Spectrometry (FAB-MS) was 537.

Synthesis of Intermediate Compound B

Compound A 7.37 g (13.7 mmol), 2-bromo-1-phenyl-1H-indole 4.08 g (15.0 mmol), Pd$_2$(dba)$_3$ 0.13 g (0.14 mmol), Ruphos 0.26 g (0.55 mmol), and NaOtBu 1.44 g (15.0 mmol) were added to a 200 mL three-neck flask under Ar atmosphere, and the mixture was stirred at 100° C. for 3 hours in a 70 mL toluene solvent. After air cooling, water was added thereto to separate the organic layer, and the solvent was distilled off. The obtained crude product was purified by column chromatography (silica gel) to obtain 6.79 g of Compound B (yield of 68%) as a white solid. The molecular weight of Compound B measured by FAB-MS was 728.

Synthesis of Compound 8

A dehydrated t-butylbenzene solution 50 mL of Compound B 6.78 g (9.3 mmol) was added to a 300 mL three-neck flask under Ar atmosphere and stirred at −78° C., and then, a pentane solution 19.5 mL (37 mmol) of 1.9 M t-BuLi was dropped (added dropwise) thereto. After completion of the dropping, the temperature was raised to 60° C., and the mixture was stirred for 2 hours, and thereafter, components having a lower boiling point than that of t-butylbenzene were distilled off under reduced pressure. The resulting mixture was cooled to −30° C., and BBr$_3$ 1.8 mL (19 mmol) was dropped thereto. After completion of the dropping, the temperature was raised to room temperature, and the mixture was stirred for 2 hours. Thereafter, the mixture was cooled again to 0° C., and N,N-diisopropylethylamine 1.7 mL (9.8 mmol) was dropped thereto. After completion of the dropping, the temperature was raised to room temperature, and the mixture was stirred for 1 hour, and then, the temperature was raised to 120° C., and the mixture was heated and stirred for 8 hours. The obtained reaction solution was cooled to room temperature, and an NaOAc aqueous solution cooled in an ice bath and toluene were added to separate the solution. Subsequently, the solution was purified by short column chromatography (silica gel) and recrystallized with a toluene/hexane solvent to obtain 5.09 g of Compound 8 (yield of 78%) as a yellow solid.

Compound 8 measured by FAB-MS and NMR was confirmed. The molecular weight of Compound 8 measured by FAB-MS was 702, and the chemical shift value δ of Compound 8 measured by ¹H-NMR (CDCl$_3$) was: 8.43 (1H), 7.94 (1H), 7.69-7.48 (6H), 7.37-7.22 (11H), 7.10-6.98 (12H), and 6.86-6.81 (4H).

2. Synthesis of Compound 10

A monoamine Compound 10 according to an embodiment of the inventive concept may be synthesized, for example, as follows:

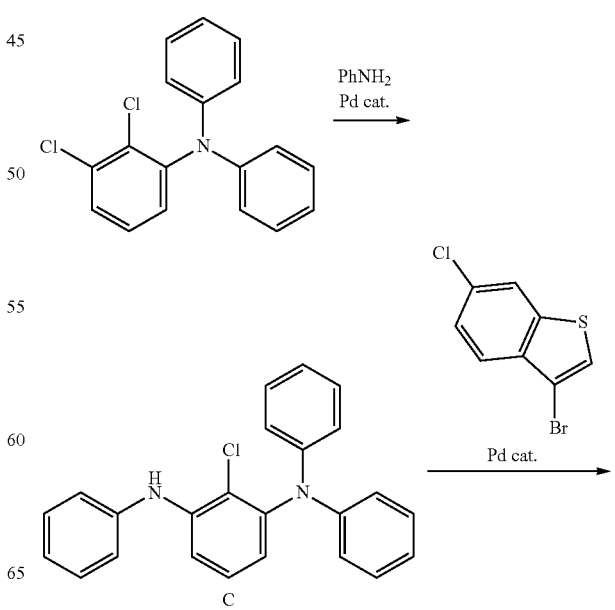

-continued

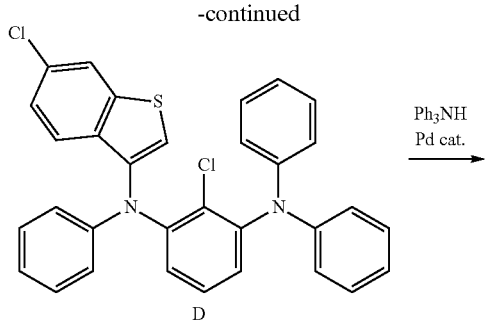

D

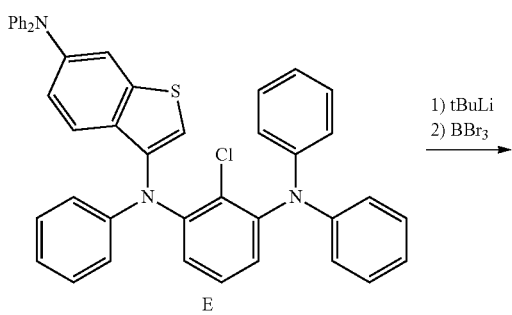

E

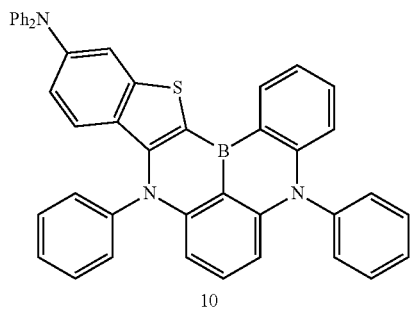

10

Synthesis of Intermediate Compound C 2,3-dichloro-N,N-diphenyl-1,3-benzenediamine 6.28 g (20 mmol), aniline 2.0 mL (22 mmol), (Amphos)PdCl$_2$ 0.71 g (1.0 mmol), and NaOtBu 2.11 g (22 mmol) were added to a 300 mL three-neck flask under Ar atmosphere, and the mixture was stirred at 120° C. for 1 hour in a 100 mL xylene solvent. After air cooling, water was added thereto to separate the organic layer, and the solvent was distilled off. The obtained crude product was purified by column chromatography (silica gel) to obtain 6.00 g of Compound C (yield of 81%) as a white solid. The molecular weight of Compound C measured by FAB-MS was 370.

Synthesis of Intermediate Compound D

Compound C 5.97 g (16.1 mmol), 3-bromo-6-chlorobenzo[b]thiophene 4.38 g (17.7 mmol), Pd$_2$(dba)$_3$ 0.15 g (0.16 mmol), Ruphos 0.30 g (0.64 mmol), and NaOtBu 1.70 g (17.7 mmol) were added to a 200 mL three-neck flask under Ar atmosphere, and the mixture was stirred at 100° C. for 3 hours in an 80 mL toluene solvent. After air cooling, water was added thereto to separate the organic layer, and the solvent was distilled off. The obtained crude product was purified by column chromatography (silica gel) to obtain 5.27 g of Compound D (yield of 61%) as a white solid. The molecular weight of Compound D measured by FAB-MS was 536.

Synthesis of Intermediate Compound E

Compound D 5.26 g (9.8 mmol), diphenylamine 1.66 g (9.8 mmol), Pd$_2$(dba)$_3$ 0.18 g (0.20 mmol), Ruphos 0.36 g (0.78 mmol), and NaOtBu 1.04 g (10.8 mmol) were added to a 200 mL three-neck flask under Ar atmosphere, and the mixture was stirred at 110° C. for 8 hours in a 50 mL toluene solvent. After air cooling, water was added thereto to separate the organic layer, and the solvent was distilled off. The obtained crude product was purified by column chromatography (silica gel) to obtain 5.05 g of Compound E (yield of 77%) as a white solid. The molecular weight of Compound E measured by FAB-MS was 669.

Synthesis of Compound 10

A dehydrated t-butylbenzene solution 40 mL of Compound E 5.03 g (7.5 mmol) was added to a 300 mL three-neck flask under Ar atmosphere and stirred at −78° C., and then, a pentane solution 15.8 mL (30 mmol) of 1.9 M t-BuLi was dropped (added dropwise) thereto. After completion of the dropping, the temperature was raised to 60° C., and the mixture was stirred for 2 hours, and thereafter, components having a lower boiling point than that of t-butylbenzene were distilled off under reduced pressure. The mixture was cooled to −30° C., and BBr$_3$ 1.4 mL (15 mmol) was dropped thereto. After completion of the dropping, the temperature was raised to room temperature, and the mixture was stirred for 2 hours. Thereafter, the mixture was cooled again to 0° C., and N,N-diisopropylethylamine 1.4 mL (8.0 mmol) was dropped thereto. After completion of the dropping, the temperature was raised to room temperature, and the mixture was stirred for 1 hour, and then, the temperature was raised to 120° C., and the mixture was heated and stirred for 8 hours. The obtained reaction solution was cooled to room temperature, and an NaOAc aqueous solution cooled in an ice bath and toluene were added to separate the solution. Subsequently, the solution was purified by short column chromatography (silica gel) and recrystallized with a toluene/hexane solvent to obtain 4.00 g of Compound 10 (yield of 83%) as a yellow solid.

Compound 10 measured by FAB-MS and NMR was confirmed. The molecular weight of Compound 10 measured by FAB-MS was 643, and the chemical shift value δ of Compound 10 measured by $^1$H-NMR (CDCl$_3$) was: 8.01 (1H), 7.77 (1H), 7.71 (1H), 7.43 (1H), 7.31-7.16 (11H), 7.10-6.98 (13H), and 6.86-6.82 (2H).

3. Synthesis of Compound 11

A monoamine Compound 11 according to an embodiment of the inventive concept may be synthesized, for example, as follows:

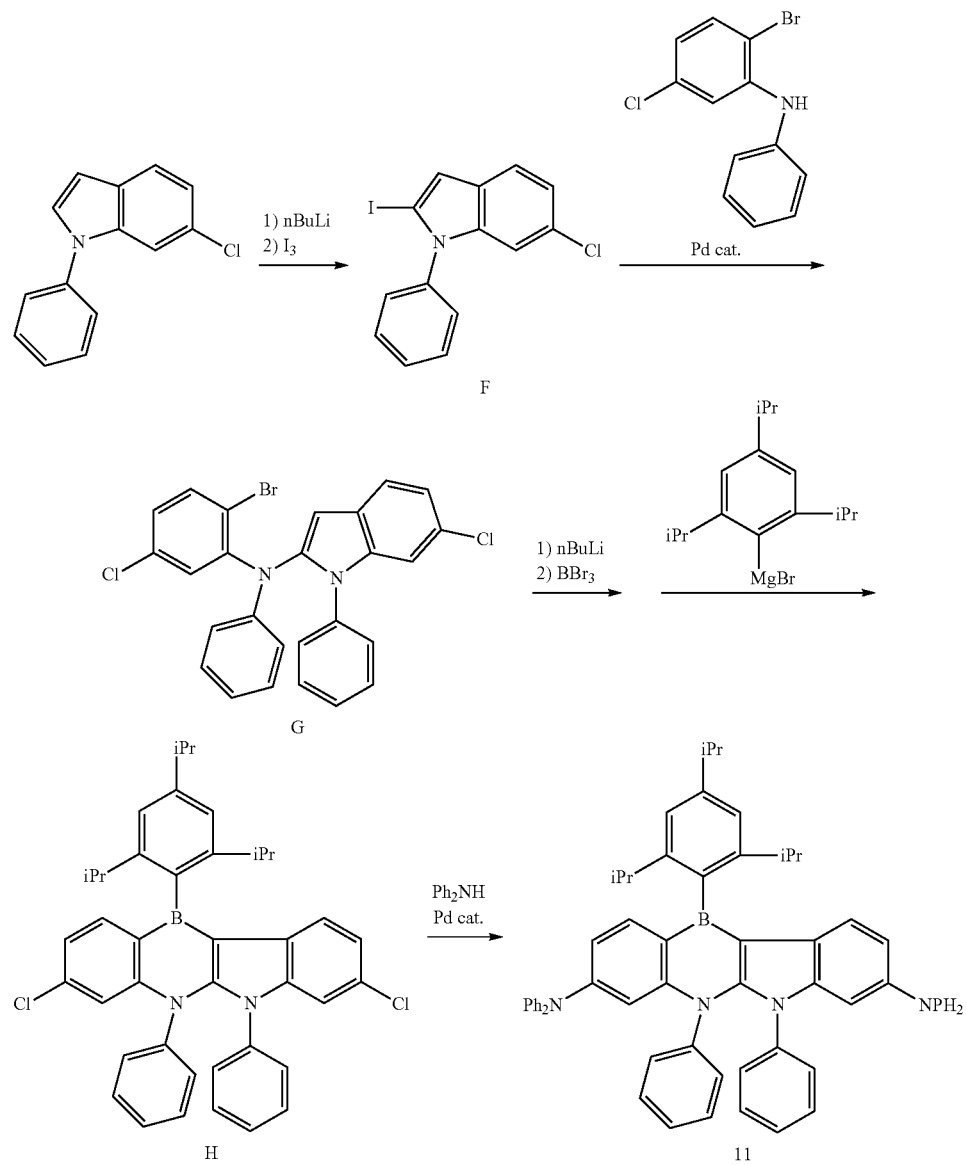

Synthesis of Intermediate Compound F

A dehydrated THF solution 100 mL of 6-chloro-1-phenyl-1H-indole 4.55 g (20 mmol) was added to a 500 mL three-neck flask under Ar atmosphere and stirred at −78° C. Then, a hexane solution 13 mL (21 mmol) of 1.6 M n-BuLi was dropped (added dropwise) thereto and stirred for 2 hours, and thereafter, stirred at room temperature for 3 hours. After the reaction, the mixture was washed with water. The obtained organic phase was concentrated to obtain a viscous material. The obtained crude product was purified by column chromatography (silica gel) to obtain 6.00 g of Compound F (yield of 85%) as a white solid. The molecular weight of Compound F measured by FAB-MS was 353.

Synthesis of Intermediate Compound G

Compound F 5.98 g (16.9 mmol), 2-bromo-5-chloro-N-phenyl-benzenamine 4.78 g (16.9 mmol), $Pd_2(dba)_3$ 0.16 g (0.17 mmol), dppf 0.25 g (0.34 mmol), and NaOtBu 1.79 g (18.6 mmol) were added to a 300 mL three-neck flask under Ar atmosphere, and the mixture was stirred at 80° C. for 6 hours in an 85 mL toluene solvent. After air cooling, water was added thereto to separate the organic layer, and the solvent was distilled off. The obtained crude product was purified by column chromatography (silica gel) to obtain 4.96 g of Compound G (yield of 58%) as a white solid. The molecular weight of Compound G measured by FAB-MS was 506.

Synthesis of Intermediate Compound H

A dehydrated THF solution 100 mL of Compound G 4.93 g (9.7 mmol) was added to a 500 mL three-neck flask under Ar atmosphere and stirred at −78° C. Then, a hexane solution 12.5 mL (20 mmol) of 1.6 M n-BuLi was dropped (added dropwise) thereto and stirred for 2 hours, and thereafter, $BBr_3$ 1.0 mL (10 mmol) was dropped thereto and stirred at −78° C. for 1 hour and stirred at room temperature for 3 hours. The mixture was cooled to 0° C., and thereafter, a THF solution 10 mL (10 mmol) of 1.0 M 2,4,6-triisopropylphenylmagnesium bromide was dropped thereto and stirred at 0° C. for 2 hours and stirred at room temperature for 3 hours. After the reaction, the mixture was washed with water. The obtained organic phase was concentrated to obtain a viscous material. The obtained crude product was purified by column chromatography (silica gel) to obtain 4.36 g of Compound H (yield of 70%) as a yellow solid. The molecular weight of Compound H measured by FAB-MS was 640.

Synthesis of Compound 11

Compound H 4.35 g (6.8 mmol), diphenylamine 2.30 g (13.6 mmol), Pd$_2$(dba)$_3$ 0.31 g (0.34 mmol), Ruphos 0.63 g (1.36 mmol), and NaOtBu 1.44 g (15.0 mmol) were added to a 200 mL three-neck flask under Ar atmosphere, and the mixture was stirred at 110° C. for 8 hours in a 70 mL toluene solvent. After air cooling, water was added thereto to separate the organic layer, and the solvent was distilled off. The obtained crude product was purified by column chromatography (silica gel) to obtain 3.20 g of Compound 11 (yield of 52%) as a yellow solid.

Compound 11 measured by FAB-MS and NMR was confirmed. The molecular weight of Compound 11 measured by FAB-MS was 906, and the chemical shift value δ of Compound 11 measured by $^1$H-NMR (CDCl$_3$) was: 8.39 (1H), 7.69-7.56 (5H), 7.31-7.22 (12H), 7.10-6.98 (15H), 6.86-6.81 (2H), 6.40 (1H), 2.90-2.85 (3H), and 1.22-1.16 (18H).

4. Synthesis of Compound 12

A monoamine Compound 12 according to an embodiment of the inventive concept may be synthesized, for example, as follows:

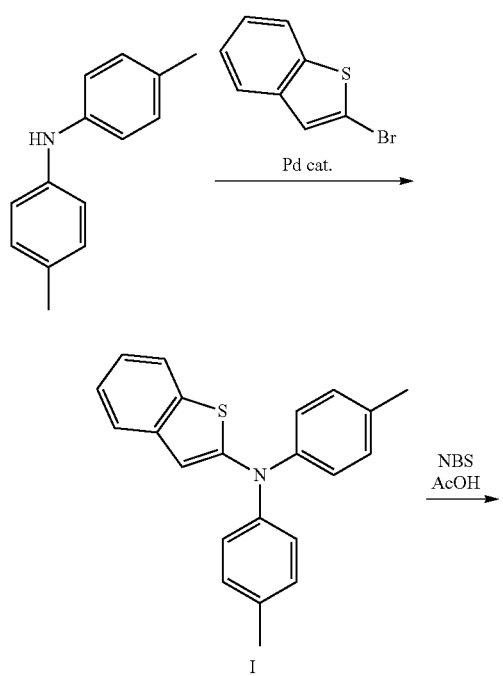

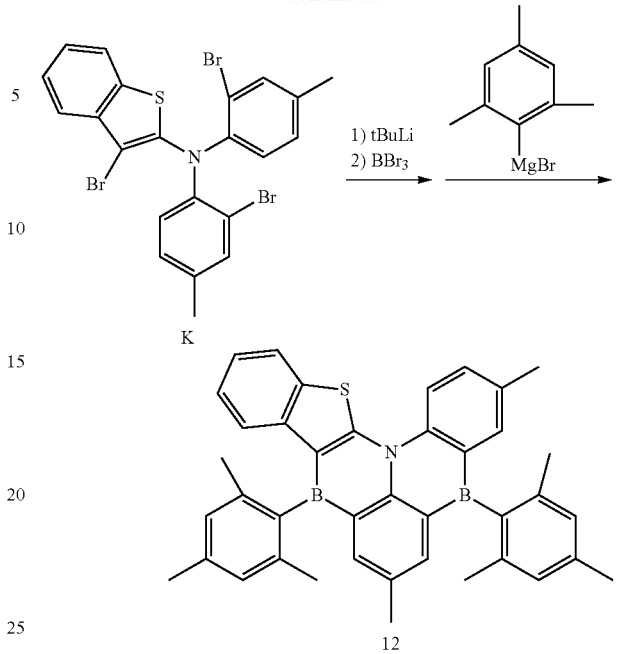

Synthesis of Intermediate Compound I p,p'-ditolylamine 9.86 g (50 mmol), 2-bromo-benzo[b]thiophene 10.65 g (50 mmol), Pd$_2$(dba)$_3$ 0.46 g (0.50 mmol), Ruphos 0.93 g (2.0 mmol), and NaOtBu 5.29 g (55 mmol) were added to a 500 mL three-neck flask under Ar atmosphere, and the mixture was stirred at 100° C. for 2 hours in a 250 mL toluene solvent. After air cooling, water was added thereto to separate the organic layer, and the solvent was distilled off. The obtained crude product was purified by column chromatography (silica gel) to obtain 15.15 g of Compound I (yield of 92%) as a white solid. The molecular weight of Compound I measured by FAB-MS was 329.

Synthesis of Intermediate Compound K

Compound 1 15.13 g (46 mmol) and N-bromosuccinimide 25.45 g (143 mmol) were added to a 1000 mL round-bottom flask, and acetic acid 30 mL was added thereto, and the mixture was stirred at 0° C. for 2 hours in a 300 mL chloroform solvent. After air cooling, a sodium thiosulfate aqueous solution was added to separate the organic layer, and the solvent was distilled off. The obtained crude product was purified by column chromatography (silica gel) to obtain 23.16 g of Compound K (yield of 89%) as a white solid. The molecular weight of Compound K measured by FAB-MS was 562.

Synthesis of Compound 12

A dehydrated t-butylbenzene solution 160 mL of Compound K 23.13 g (40.9 mmol) was added to a 1000 mL three-neck flask under Ar atmosphere and stirred at −78° C., and then, a pentane solution 129 mL (245 mmol) of 1.9 M t-BuLi was dropped (added dropwise) thereto. After completion of the dropping, the temperature was raised to room temperature, and the mixture was stirred for 2 hours. Thereafter, the mixture was cooled to −30° C., and BBr$_3$ 7.8 mL (82 mmol) was dropped thereto. After completion of the dropping, the temperature was raised to room temperature, and the mixture was stirred for 2 hours. And then, the temperature was raised to 160° C., and the mixture was heated and stirred for 10 hours. The reaction solution was cooled to 0° C., and a THF solution 164 mL (164 mmol) of 1.0 M 2,4,6-trimethylphenylmagnesium bromide was dropped thereto and stirred at 0° C. for 2 hours and stirred at room temperature for 3 hours. After the reaction, a phosphate buffer solution (pH 6) and toluene were added to separate the solution. Subsequently, the solution was purified by column chromatography (silica gel) and recrystallized with a toluene/hexane solvent to obtain 4.55 g of Compound 12 (yield of 19%) as a yellow solid.

Compound 12 measured by FAB-MS and NMR was confirmed. The molecular weight of Compound 12 measured by FAB-MS was 585, and the chemical shift value δ of Compound 12 measured by $^1$H-NMR (CDCl$_3$) was: 8.05 (1H), 7.93 (1H), 7.51-7.40 (2H), 7.19-7.11 (5H), 6.99-6.95 (4H), 2.38-2.31 (18H), and 2.20-2.16 (6H).

Example of Device Fabrication

The organic electroluminescence devices in Examples 1 to 4 were fabricated using the polycyclic compounds of the described compounds 8, 10, 11, and 12 as emission layer materials. The compounds used in the emission layers of Examples 1 to 4 are shown below:

[Compounds in Examples]

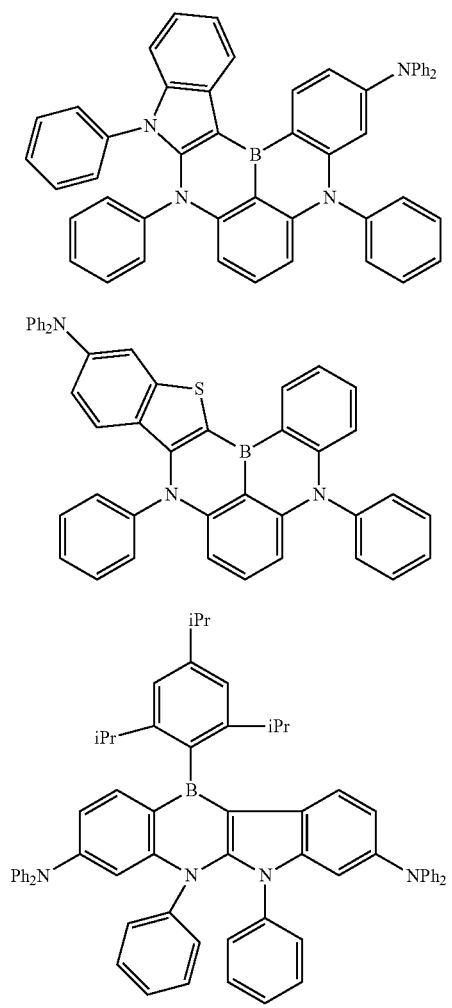

-continued

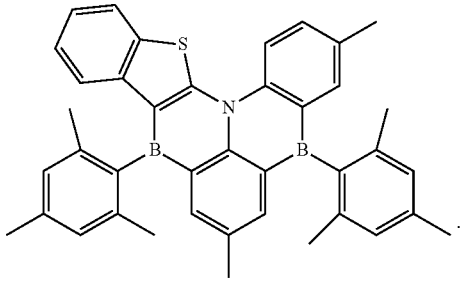

The organic electroluminescence devices of Comparative Examples 1 to 4 were fabricated using Comparative Compounds R-1 to R-4 shown below as emission layer materials:

Compounds in Comparative Examples

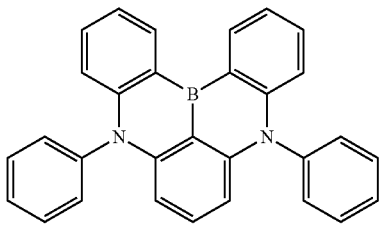

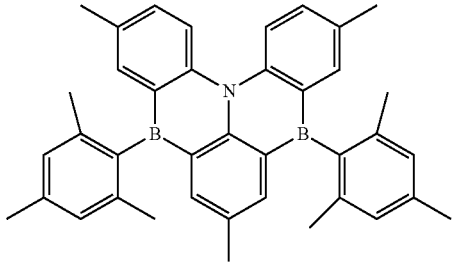

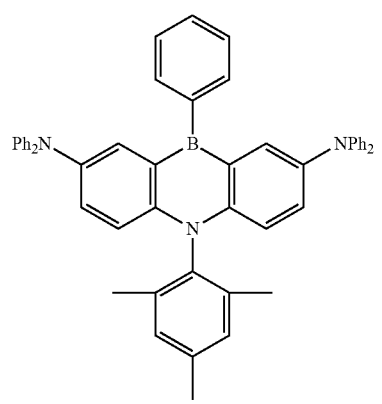

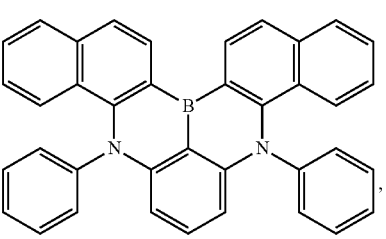

The organic electroluminescence devices in Examples 1 to 4 and Comparative Examples 1 to 4 were each independently formed by performing the following process: ITO having a thickness of 1500 Å was patterned on a glass substrate and washed with ultrapure water and treated with UV ozone for 10 minutes; Thereafter, HAT-CN was deposited to have a thickness of 100 Å, and α-NPD was deposited to have a thickness of 800 Å, and mCP was deposited to have a thickness of 50 Å, and thus, a hole transport region was formed;

Next, the emission layer was formed by co-depositing the respective polycyclic compound of the present embodiments or the respective Comparative Compound and DPEPO at a ratio of 20:80 to form a layer having a thickness of 200 Å; Next, a layer having a thickness of 100 Å was formed using DPEPO. Accordingly, the emission layers formed by the co-deposition were deposited by mixing Compounds 8, 10, 11, and 12, respectively, with DPEPO in Examples 1 to 4, and by mixing Comparative Compounds R-1, R-2, R-3, and R-4, respectively, with DPEPO in Comparative Examples 1 to 4;

A layer having a thickness of 300 Å was formed on the emission layer using TPBi, and a layer having a thickness of 5 Å was formed using LiF, and thus, an electron transport region was formed. Subsequently, a second electrode having a thickness of 1000 Å was formed using aluminum (Al).

The hole transport region, the emission layer, the electron transport region, and the second electrode were formed using a vacuum deposition apparatus.

Performance Evaluation of Organic Electroluminescence Device

A maximum emission wavelength (nm) and an external quantum yield (%) were measured to evaluate the characteristics of the organic electroluminescence devices according to Examples and Comparative Examples. In the measurement, luminance orientation characteristic measuring apparatus of Hamamatsu Photonics C9920-11 was used as measuring apparatus. Life-time represents the luminance half-time from the initial luminance of 100 cd/m$^2$, and EQE (external quantum efficiency or external quantum yield) refers to a value at 10 mA/cm$^2$.

TABLE 1

| Division | Dopant of emission layer | External quantum yield (%) | Life-time LT$_{50}$ (h) |
|---|---|---|---|
| Example 1 | Compound 8 | 15.3 | 19.4 |
| Example 2 | Compound 10 | 19.8 | 33.4 |
| Example 3 | Compound 11 | 16.3 | 10.8 |
| Example 4 | Compound 12 | 21.2 | 11.4 |
| Comparative Example 1 | Comparative Compound R-1 | 12.8 | 2.9 |
| Comparative Example 2 | Comparative Compound R-2 | 14.4 | 3.8 |
| Comparative Example 3 | Comparative Compound R-3 | 6.9 | 9.8 |
| Comparative Example 4 | Comparative Compound R-4 | 7.2 | 8.5 |

Referring to Table 1, it could be found that the organic electroluminescence devices in Examples 1 to 4 in which the polycyclic compounds of the present embodiments were used as dopant materials in the emission layer exhibited high external quantum efficiency compared to the organic electroluminescence devices of Comparative Examples 1 to 4. It could also be found that the organic electroluminescence devices in Examples 1 to 4 in which the polycyclic compounds of the present embodiments were used as dopant materials of the emission layer exhibited a long life-time compared to the organic electroluminescence devices of Comparative Examples 1 to 4.

Referring to the results in Table 1, it is believed that the compounds in Examples may be used as thermally activated delayed fluorescence materials having high efficiency and long life-time.

The organic electroluminescence device may exhibit high luminous efficiency by including the polycyclic compounds of the present embodiments.

Compared with Examples, it could be found that the organic electroluminescence devices of Comparative Examples 1 to 4 exhibited low external quantum efficiency and low device life-time since Comparative Compounds R-1 to R-4 did not contain a suitably stable heteroaryl ring (heteroaryl group) in a core molecule.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present invention have been described, it is understood that the present invention should not be limited to these example embodiments, but that various changes and modifications can be made by one of ordinary skill in the art within the spirit and scope of the present invention as defined by the following claims and equivalents thereof.

Therefore, the technical scope of the present invention should not be limited to the contents described in the detailed description of the specification, but should be defined by the claims and their equivalents.

What is claimed is:

1. An organic electroluminescence device comprising:
    a first electrode;
    a hole transport region on the first electrode;
    an emission layer on the hole transport region;
    an electron transport region on the emission layer; and
    a second electrode on the electron transport region,
    wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof, and wherein the emission layer comprises a polycyclic compound represented by Formula 3:

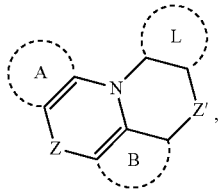

Formula 3 in Formula 3,
Ring A and Ring B are each independently a substituted or unsubstituted aryl group having 6 to 30 carbon atoms for forming a ring, or a substituted or unsubstituted heteroaryl group having 2 to 30 carbon atoms for forming a ring, and at least one selected from Ring A or Ring B is represented by Formula 2,
wherein when Ring A is Formula 2, $R_1$ and $R_2$ are combined to form a ring:

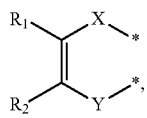

Formula 2 in Formula 2,
X and Y are O, X and Y are S, X is O and Y is S, X is S and Y is O, or
X and Y are each independently a direct bond, SO, $SO_2$, Se, $PR_4$, $POR_5$, $PSR_6$, $SiR_7F_8$, $GeR_9R_{10}$ or $BR_{11}$, provided that X and Y are not both a direct bond at the same time, and
$R_1$ and $R_2$ are each independently a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted aryl group having 6 to 30 carbon atoms for forming a ring, or a substituted or unsubstituted heteroaryl group having 2 to 30 carbon atoms for forming a ring,
$R_4$ to $R_{11}$ are each independently a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring,
wherein one or more selected from $R_1$, $R_2$, $R_4$, $R_5$, $R_6$, $R_7$, $R_8$, $R_9$, $R_{10}$, or $R_{11}$ are optionally combined with an adjacent group to form a ring,
Ring L is a substituted or unsubstituted aryl group having 6 to 30 carbon atoms for forming a ring, or a substituted or unsubstituted heteroaryl group having 2 to 30 carbon atoms for forming a ring,
Z and Z' are each independently selected from $BAr_2$, $POAr_3$, $PSAr_4$, $SiAr_5Ar_6$, or $GeAr_7Ar_8$, and
$Ar_2$ to $Ar_8$ are each independently a substituted or unsubstituted amino group, a substituted or unsubstituted oxy group, a substituted or unsubstituted alkyl group having 1 to 10 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, wherein Z and Z' in Formula 3 are the same.

2. The organic electroluminescence device of claim 1, wherein the emission layer is configured to emit delayed fluorescence.

3. The organic electroluminescence device of claim 1, wherein the emission layer is a thermally activated delayed fluorescence emission layer configured to emit blue light.

4. The organic electroluminescence device of claim 1, wherein Z is $BAr_2$.

5. The organic electroluminescence device of claim 4, wherein Z is represented by Formula 5:

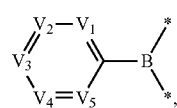

Formula 5 in Formula 5,
$V_1$ to $V_5$ are each independently $CR_{12}$ or N, and
$R_{12}$ is a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, wherein $R_{12}$ is optionally bonded to adjacent group to form a ring.

6. The organic electroluminescence device of claim 5, wherein $V_1$ to $V_5$ are each independently $CR_{12}$, and $R_{12}$ is a hydrogen atom, a deuterium atom, or a substituted or unsubstituted alkyl group having 2 to 10 carbon atoms.

7. A polycyclic compound represented by Formula 3:

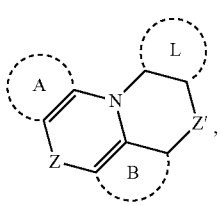

Formula 3 in Formula 3,
Ring A and Ring B are each independently a substituted or unsubstituted aryl group having 6 to 30 carbon atoms for forming a ring, or a substituted or unsubstituted heteroaryl group having 2 to 30 carbon atoms for forming a ring, and at least one selected from Ring A or Ring B is represented by Formula 2, wherein when Rind A is Formula 2, $R_1$ and $R_2$ are combined to form a ring:

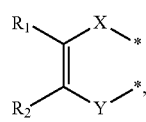

Formula 2 in Formula 2,

X and Y are O, X and Y are S, X is O and Y is S, X is S and Y is O, or

X and Y are each independently a direct bond, SO, $SO_2$, Se, $PR_4$, $POR_5$, $PSR_6$, $SiR_7R_8$, $GeR_9R_{10}$ or $BR_{11}$, provided that X and Y are not both a direct bond at the same time, and $R_1$ and $R_2$ are each independently a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted aryl group having 6 to 30 carbon atoms for forming a ring, or a substituted or unsubstituted heteroaryl group having 2 to 30 carbon atoms for forming a ring, $R_4$ to $R_{11}$ are each independently a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, wherein one or more selected from $R_1$, $R_2$, $R_4$, $R_5$, $R_6$, $R_7$, $R_8$, $R_9$, $R_{10}$, or $R_{11}$ are optionally combined with an adjacent group to form a ring, Ring L is a substituted or unsubstituted aryl group having 6 to 30 carbon atoms for forming a ring, or a substituted or unsubstituted heteroaryl group having 2 to 30 carbon atoms for forming a ring, Z and Z' are each independently selected from $BAr_2$, $POAr_3$, $PSAr_4$, $SiAr_5Ar_6$, or $GeAr_7Ar_8$, and $Ar_2$ to $Ar_8$ are each independently a substituted or unsubstituted amino group, a substituted or unsubstituted oxy group, a substituted or unsubstituted alkyl group having 1 to 10 carbon atoms, a substituted or unsubstituted aryl group having 6 to 30 carbon atoms for forming a ring, a substituted or unsubstituted aralkyl group having 7 to 30 carbon atoms, or a substituted or unsubstituted heteroaryl group having 2 to 30 carbon atoms for forming a ring, wherein Z and Z' in Formula 3 are the same.

8. The polycyclic compound of claim 7, wherein Z is $BAr_2$.

9. The polycyclic compound of claim 8, wherein Z is represented by Formula 5:

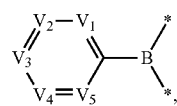

Formula 5 in Formula 5, $V_1$ to $V_5$ are each independently $CR_{12}$ or N, and $R_{12}$ is a hydrogen atom, a deuterium atom, a halogen atom, a cyano group, a substituted or unsubstituted oxy group, a substituted or unsubstituted thiol group, a substituted or unsubstituted amine group, a phosphine oxide group, a phosphine sulfide group, a silyl group, a carbonyl group, a boron group, a substituted or unsubstituted alkyl group having 1 to 10 carbon atoms, a substituted or unsubstituted aralkyl group having 7 to 30 carbon atoms, a substituted or unsubstituted aryl group having 6 to 30 carbon atoms for forming a ring, or a substituted or unsubstituted heteroaryl group having 2 to 30 carbon atoms for forming a ring, wherein $R_{12}$ is optionally bonded to adjacent group to form a ring.

10. The polycyclic compound of claim 9, wherein $V_1$ to $V_5$ are each independently $CR_{12}$, and $R_{12}$ is a hydrogen atom, a deuterium atom, or a substituted or unsubstituted alkyl group having 2 to 10 carbon atoms.

11. An organic electroluminescence device comprising:

a first electrode;

a hole transport region on the first electrode;

an emission layer on the hole transport region;

an electron transport region on the emission layer; and a second electrode on the electron transport region, wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof, and wherein the emission layer comprises the polycyclic compound of claim 7.

12. The organic electroluminescence device of claim 11, wherein the emission layer is configured to emit delayed fluorescence.

13. The organic electroluminescence device of claim 11, wherein the emission layer is a delayed fluorescence emission layer comprising a host and a dopant, wherein the dopant is the polycyclic compound.

14. The organic electroluminescence device of claim 11, wherein the emission layer is a thermally activated delayed fluorescence emission layer configured to emit blue light.

* * * * *

UNITED STATES PATENT AND TRADEMARK OFFICE
CERTIFICATE OF CORRECTION

PATENT NO. : 11,825,733 B2
APPLICATION NO. : 16/568068
DATED : November 21, 2023
INVENTOR(S) : Akinori Yamatani It is certified that error appears in the above-identified patent and that said Letters Patent is hereby corrected as shown below:

In the Claims

In Column 37, Line 36, in Claim 1, delete "$SiR_7F_8$," and insert -- $SiR_7R_8$, --.

In Column 39, Line 4, in Claim 7, delete "Rind" and insert -- Ring --.

Signed and Sealed this
Second Day of April, 2024

Katherine Kelly Vidal
*Director of the United States Patent and Trademark Office*